Figure 1:
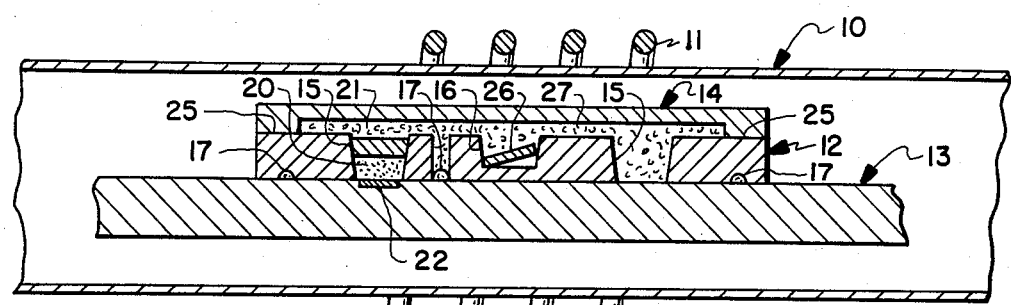
Figure 2:
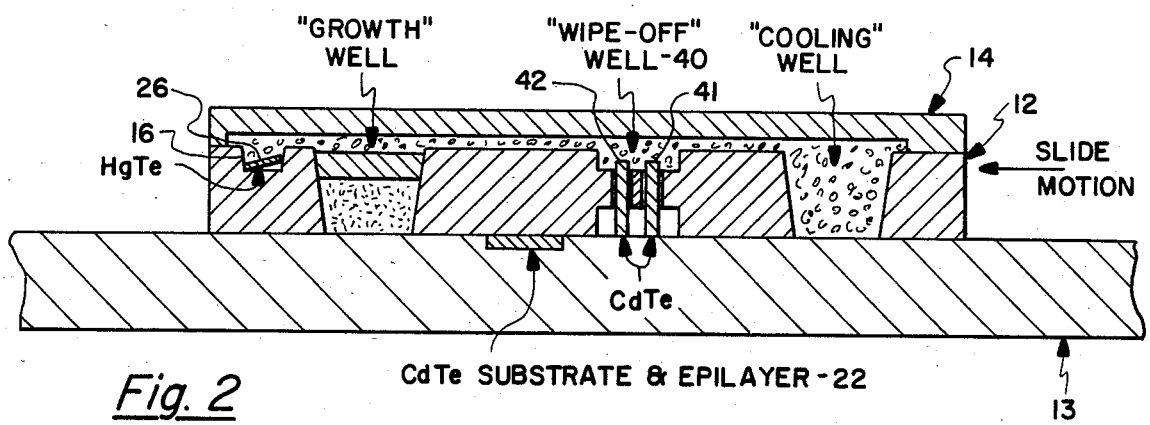
Figure 3:
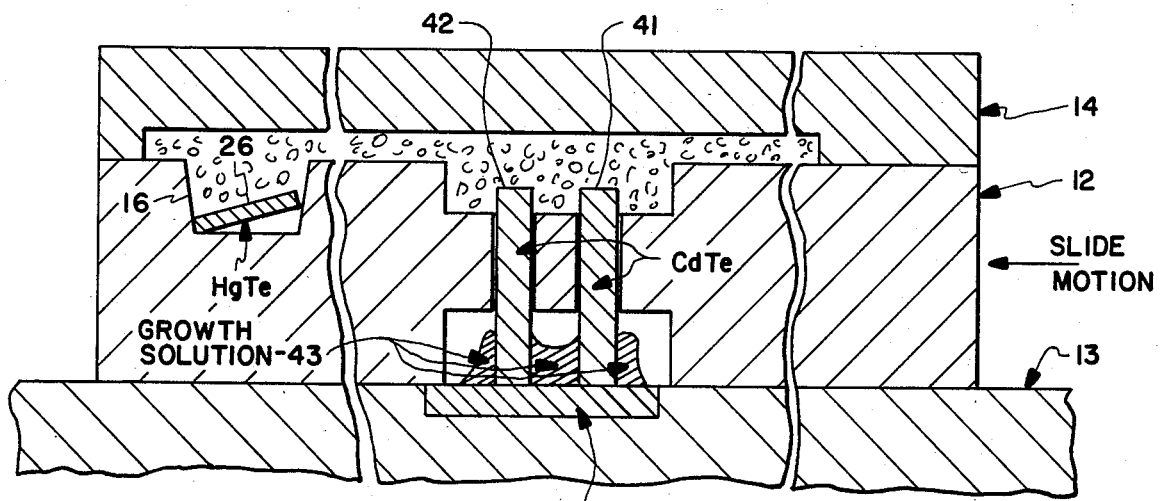

United States Patent [19]

Hager et al.

[11] Patent Number: 4,592,304
[45] Date of Patent: Jun. 3, 1986

[54] APPARATUS FOR LIQUID PHASE EPITAXY OF MERCURY CADMIUM TELLURIDE

[75] Inventors: Robert J. Hager, Minneapolis; R. Andrew Wood, Bloomington, both of Minn.

[73] Assignee: Honeywell Inc., Minneapolis, Minn.

[21] Appl. No.: 712,836

[22] Filed: Mar. 18, 1985

[51] Int. Cl.⁴ .......................................... H01L 21/208
[52] U.S. Cl. .................................. 118/415; 118/412; 118/421
[58] Field of Search ............... 118/421, 407, 412, 415, 118/422, 120; 156/621, 622, 624; 148/171, 172

[56] References Cited

U.S. PATENT DOCUMENTS

| | | | |
|---|---|---|---|
| 3,747,562 | 7/1973 | Stone et al. | 118/415 |
| 3,890,194 | 6/1975 | Ettenberg | 118/415 X |
| 4,317,689 | 5/1982 | Bowers et al. | 118/415 X |
| 4,366,771 | 1/1983 | Bowers et al. | 118/415 |

Primary Examiner—John P. McIntosh
Attorney, Agent, or Firm—Omund R. Dahle

[57] ABSTRACT

In a covered graphite slider apparatus for the liquid phase epitaxial growth of mercury cadmium telluride this invention shows the addition of a wipe-off well into the moving part of the slider apparatus, which well contains pieces of CdTe to assist wipe-off of HgCdTe following LPE growth.

1 Claim, 3 Drawing Figures

APPARATUS FOR LIQUID PHASE EPITAXY OF MERCURY CADMIUM TELLURIDE

BACKGROUND AND SUMMARY OF THE INVENTION

The U.S. Government has rights in this invention pursuant to a contract awarded by the Department of Air Force.

The subject matter of this invention generally relates to the field of apparatus used for the liquid phase epitaxial growth of $(Hg_{1-x}Cd_x)Te$ films.

The prior art such as U.S. Pat. Nos. 4,317,689 or 4,366,771 (both assigned to the same assignee as the present application) teaches a covered graphite slider system for LPE growth of HgCdTe. $Hg_{1-x}Cd_xTe$ is an important semiconductor for use in photovoltaic and photoconductive infrared photon detectors. $Hg_{1-x}Cd_xTe$ can be grown by liquid phase epitaxy at atmospheric pressure from a Te-rich solution in which case the Hg vapor pressure is below 0.1 atm at 500° C. This low vapor pressure makes possible the use of open-tube, slider growth techniques. The teachings of these patents is incorporated by reference.

In FIG. 1, one of the figures is reproduced from the prior art patent. A quartz tube 10, of which a partial section is shown, provides the conventional furnace enclosure within which the $Hg_{1-x}Cd_xTe$ is grown. A suitable source of heat, such as a heating coil 11 around the tube, provides the desired temperature for the liquid phase epitaxy growth of $Hg_{1-x}Cd_xTe$. The graphite furnace boat comprises a slider or carrier section 12, a base section 13, and a cover section 14. The slider section 12 has one or more wells 15 extending through the section, and has a more shallow well or depression 16. The bottom surface of the slider section 12 has a continuous trough or groove 17 therein looping around the bottom near the perimeter. A channel extending in a vertical direction through the slider section connects the groove 17 to the top surface. The well 15 is adapted to contain a growth solution 20 of $(Hg_{1-x}Cd_x)_{1-y}Te_y$. A plug 21 caps the well. The base section 13 of the boat has a recess 22 in the top surface thereof. The purpose of the recess is to receive a growth substrate, such as CdTe, upon which the LPE layer of $Hg_{1-x}Cd_xTe$ is epitaxially grown. The cover section 14 of the boat has a shoulder 25 on its lower face and extending around its perimeter which is machined to fit closely to the upper surface of the slider section 12.

When growing $Hg_{1-x}Cd_xTe$ in the apparatus of FIG. 1, a growth substrate is placed in the recess 22. A charge 20 of $(Hg_{1-x}Cd_x)_{1-y}Te_y$ is placed in the well 15 and the well capped with plug 21. It is necessary to prevent loss of Hg from the charge 20 during the growth procedure. A Hg source wafer 26 of HgTe plus Te is placed in shallow well 16. The cover 14 is placed over the slider 12 and the furnace boat is placed in the tube 10, is purged, and is heated to 500° C. A source of $H_2$ gas is caused to flow in the quartz tube. When the equilibration is reached, the slider is moved with respect to the base to position the well 15 with $(Hg_{1-x}Cd_x)_{1-y}Te_y$ charge 20 over the substrate in recess 22 so that the epitaxial growth can commence. The purpose of the wafer 26 is to give up Hg thereby pressurizing the growth area, i.e., the region 27 under the cover 14, in the wells 15 of the slider and in the groove or moat 17 around the bottom of the slider. Since this is a slider assembly, some Hg vapor leaks and diffuses out of the boat through the cover fit or through the sliding fit between slider section 12 and base section 13 and into the $H_2$ gas stream contained in the quartz tube 10. The Hg which escapes is replaced by dissociation of the source wafer 26 to thereby maintain a constant Hg pressure over the plug 21, and around the growth solution 20 and growth substrate. Since the partial pressure of Hg from the source wafer 26 of HgTe is the same as the partial pressure of Hg from the charge 20, i.e. about 0.1 atm, there is prevented any loss of Hg from the charge 20 and the LPE grown layer of $Hg_{1-x}Cd_xTe$ on the substrate. The apparatus of FIG. 1 establishes the environment in which the improvement of the present invention is useful.

One limitation of the prior art is that some of the growth solution tends to adhere to the surface of the HgCdTe epilayer after growth in the slider apparatus. The present invention is an improvement over the prior art in the use of CdTe pieces to assist wipe-off of HgCdTe following LPE growth.

BRIEF DESCRIPTION OF THE DRAWINGS

FIG. 1 is an example of the prior art.

FIGS. 2 and 3 show the invention.

DESCRIPTION

Turning now to FIG. 2, a "wipe-off" well 40 is incorporated into the moving part 12 of the slider apparatus. This well 40 holds several pieces of CdTe 41 and 42 in vertical slots about 1 mm apart. The slots are cut into the well as guides for the CdTe pieces. The CdTe pieces are polycrystalline unpolished pieces which are a sliding fit in their slots, so that they naturally rest against the upper surface of the base section 13. As the CdTe pieces pass across the surface of the grown epilayer after growth is completed, they remove any residual growth solution 43, FIG. 3, by mechanical wiping, by surface tension adhesion between the CdTe and the growth solution, and by capillary wicking of the growth solution into the space between the two CdTe pieces. Use of this wipe-off well 40 eliminates residual growth solution otherwise left on the epilayer. The wipe-off well is pressured with Hg from the HgTe reservoir 26 as was described for the other areas in discussion above. After cooldown, the two CdTe pieces are discarded as waste.

The embodiments of the invention in which an exclusive property or right is claimed are defined as follows:

1. In a covered graphite slider apparatus for liquid epitaxy growth of mercury cadmium telluride comprising:

a furnace enclosure having therein a graphite furnace boat, the boat further comprising:

a graphite base member having a generally planar top face and having a recess portion in the top face, the recess portion being adapted to receive a semiconductor substrate for epitaxial growth thereon;

an improved graphite slider member having a planar lower face adapted to mate with and to be slideable along said base member top face, said slider member having a first well extending therethrough from a top surface to the lower face for receiving and holding a charge of $(Hg_{1-x}Cd_x)_{1-y}Te_y$, said first well being slideable over said substrate for epitaxial growth of HgCdTe thereon, a second "wipe off" well adjacent to said first well in said slider member and extending through said member to the lower face, which second well has CdTe material loosely placed therein, said CdTe being slideable over the epilayer surface by movement of said slider member following LPE growth to pick up residual growth solution left on the epilayer surfaces, the second "wipe off" well further comprising vertical slots formed in the well, said vertical slots acting as guides for CdTe pieces, said top surface having a depression therein adapted to receive a mercury supplying charge to said wells; and, a graphite cover positioned for covering said slider member top surface.

* * * * *